United States Patent
Schulz

(10) Patent No.: US 9,118,343 B2
(45) Date of Patent: Aug. 25, 2015

(54) DELTA-SIGMA MODULATOR WITH HIGH INPUT IMPEDANCE

(71) Applicant: Power Integrations, Inc., San Jose, CA (US)

(72) Inventor: Frank J. Schulz, Ottawa (CA)

(73) Assignee: Power Integrations, Inc., San Jose, CA (US)

(*) Notice: Subject to any disclaimer, the term of this patent is extended or adjusted under 35 U.S.C. 154(b) by 0 days.

(21) Appl. No.: 14/470,826

(22) Filed: Aug. 27, 2014

(65) Prior Publication Data

US 2014/0368369 A1 Dec. 18, 2014

Related U.S. Application Data

(63) Continuation of application No. 13/919,747, filed on Jun. 17, 2013, now Pat. No. 8,847,805.

(51) Int. Cl.
H03M 3/00 (2006.01)

(52) U.S. Cl.
CPC ............... *H03M 3/39* (2013.01); *H03M 3/322* (2013.01); *H03M 3/43* (2013.01); *H03M 3/496* (2013.01)

(58) Field of Classification Search
CPC .......... H03M 3/39; H03M 3/22; H03M 3/496
USPC .................. 341/143, 155, 172, 144, 118, 120
See application file for complete search history.

(56) References Cited

U.S. PATENT DOCUMENTS

| 3,818,246 | A | 6/1974 | Hellwarth et al. |
|---|---|---|---|
| 6,573,785 | B1 | 6/2003 | Callicotte et al. |
| 7,110,732 | B2 | 9/2006 | Mostafa et al. |
| 7,679,540 | B2 | 3/2010 | Ceballos et al. |
| 8,581,770 | B2 | 11/2013 | Wang et al. |
| 2006/0082481 | A1 | 4/2006 | Oprescu |

FOREIGN PATENT DOCUMENTS

| DE | 102011081992 A1 | 3/2013 |
|---|---|---|
| WO | 2011/058259 A2 | 5/2011 |

OTHER PUBLICATIONS

Notice of Allowance received for U.S. Appl. No. 13/919,747, mailed on May 28, 2014, 8 pages.

International Search Report & Written Opinion received for PCT Patent Application No. PCT/US2014/038484, mailed on Oct. 21, 2014, 11 pages.

*Primary Examiner* — Peguy Jean Pierre
(74) *Attorney, Agent, or Firm* — Blakely Sokoloff Taylor & Zafman LLP

(57) ABSTRACT

Measurement circuits having a delta-sigma modulator are disclosed. One example measurement circuit includes a low pass filter coupled to receive an input voltage, a switched-capacitor integrator circuit, and a switched comparator circuit. The measurement circuit may generate a digital output made up of a sequence of logic high and logic low levels that are representative of a scaled value of the input voltage output by the low pass filter circuit. Also, by virtue of its switched-capacitor configuration, the electric charge received by the switched difference amplifier circuit may be returned to the input in a manner such that the input to the delta-sigma modulator takes little to no average current from the voltage it measures. In other words, the delta-sigma modulator may have a high input impedance by virtue of its switched-capacitor circuit configuration.

16 Claims, 6 Drawing Sheets

US 9,118,343 B2

DELTA-SIGMA MODULATOR WITH HIGH INPUT IMPEDANCE

CROSS-REFERENCE TO RELATED APPLICATIONS

This application is a Continuation application of U.S. application Ser. No. 13/919,747, entitled DELTA-SIGMA MODULATOR WITH HIGH INPUT IMPEDANCE, filed Jun. 17, 2013, which is hereby incorporated by reference in its entirety and for all purposes.

BACKGROUND

1. Field

The present disclosure relates generally to analog-to-digital converters and, more specifically, to analog-to-digital converters that receive low currents from voltage signals at their inputs.

2. Discussion of the Related Art

Many electronic devices process information in the form of binary digits. The devices may be as complex as a smart mobile telephone or as simple as a controller for a household appliance. The binary digits often represent the value of an analog signal that the device receives as an input. In those devices that represent an analog input signal in digital form, an analog-to-digital converter may be used to translate the analog signal into a sequence of binary digits that may be processed by digital circuits. A common type of analog-to-digital converter uses a delta-sigma modulator to receive the analog signal.

A controller for an off-line power converter is one example of an electronic device that may use a delta-sigma modulator to receive an analog signal. In a controller for a power converter, the analog signal may represent the measurement of an input voltage that an analog-to-digital converter translates to a sequence of binary digits. The input voltage of an off-line power converter is typically a sinusoidal waveform with amplitude greater than 150 volts. In many parts of the world, the common household voltage that would be the input to an off-line power converter has a peak value greater than 300 volts, and may reach nearly 375 volts under transient conditions. Controllers often measure the input voltage for several purposes, such as, regulating an output voltage or shaping the waveform of an input current to follow the waveform of the input voltage.

Circuits that measure a high input voltage typically do so by using a potential divider, such as a resistive divider, across the input to provide a known fraction of the input voltage as a signal voltage that is low enough for the measurement circuit to handle. In order to reduce power consumption, the components of the divider are selected to minimize the amount of current the circuit draws from the input voltage. However, the current needs to be large enough to guarantee a reliable measurement in the presence of noise.

A circuit, such as a common delta-sigma modulator, that measures the reduced-signal voltage provided by the potential divider, typically takes current from the voltage that it measures. Although the delta-sigma modulator takes current from the reduced-signal voltage provided by the potential divider, that current is obtained from the high voltage source of the input voltage and is passed through the potential divider. Since the power taken from the source of the input voltage is proportional to the product of the voltage and the current, and because the peak value of the input may be hundreds of volts, even the smallest current sufficient for reliable measurement can still result in a significant loss of power, especially when the power converter has a light load or no load.

Thus, since circuits with high input impedances take less current from a given voltage than a circuit with low input impedance, a delta-sigma modulator with high input impedance is desired to reduce the power consumption of circuits that measure relatively high voltages.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION

In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment," "an embodiment," "one example," or "an example" means that a particular feature, structure or characteristic described in connection with the embodiment or example is included in at least one embodiment of the present invention. Thus, appearances of the phrases "in one embodiment," "in an embodiment," "one example," or "an example" in various places throughout this specification are not necessarily all referring to the same embodiment or example. Furthermore, the particular features, structures, or characteristics may be combined in any suitable combinations and/or subcombinations in one or more embodiments or examples. Particular features, structures, or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

Figure 1:
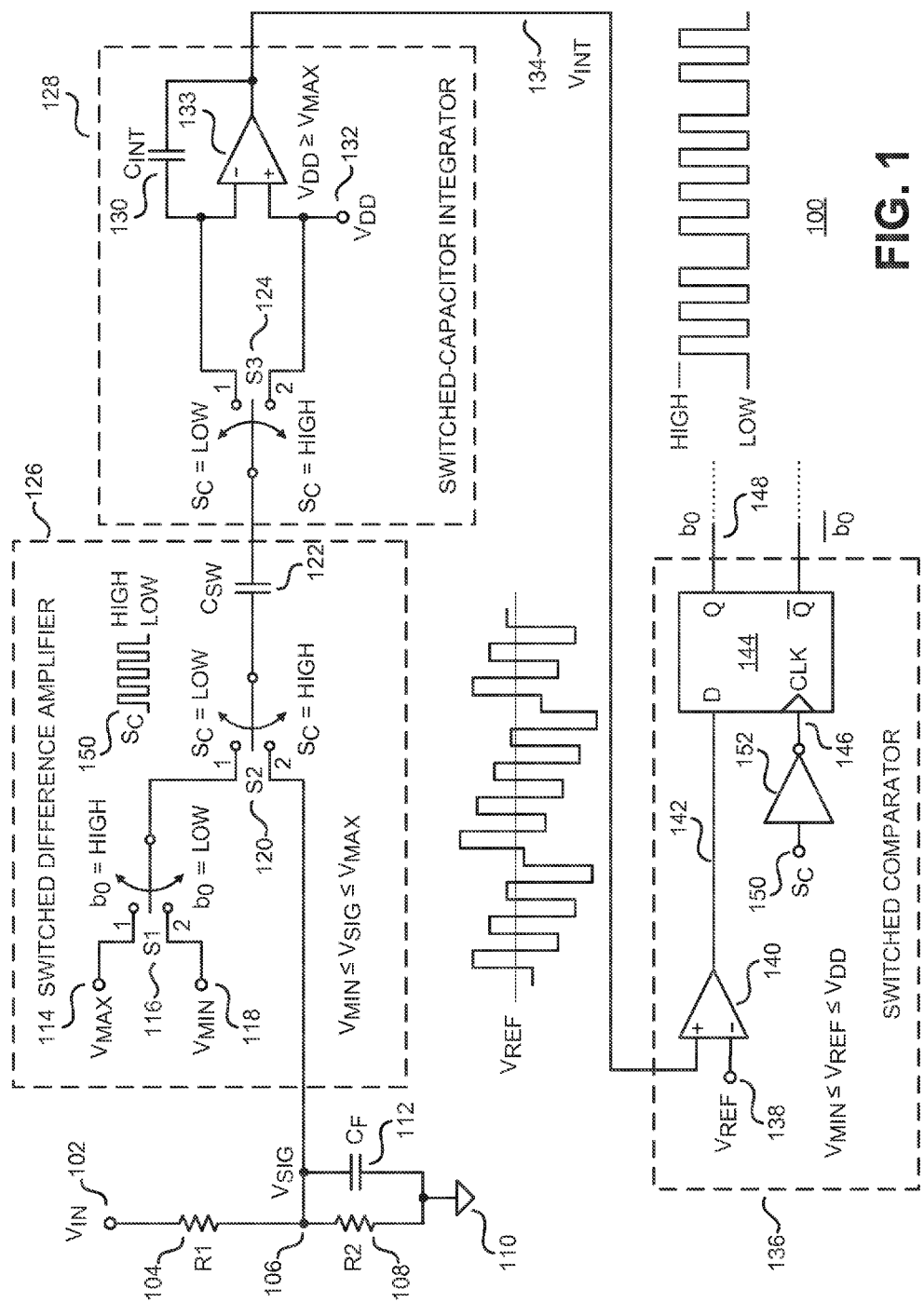
FIG. 1 is a schematic diagram that shows the salient features of an example delta-sigma modulator with high input impedance according to various examples.

The schematic diagram of FIG. 1 illustrates an example measurement circuit 100 having a delta-sigma modulator that measures an analog input voltage $V_{IN}$ 102 with respect to an input return 110. In some examples, measurement circuit 100 may be included within a controller for a power converter, and analog input voltage $V_{IN}$ 102 may be the rectified input voltage to the power converter. The rectified input voltage may not go negative with respect to the input return 110, but may preserve the peak values of the sinusoidal input voltage. The example delta-sigma modulator in the measurement circuit of FIG. 1 includes a switched difference amplifier circuit 126, a switched-capacitor integrator circuit 128, and a switched comparator circuit 136. The "delta" in the name of the modulator is a reference to the difference amplifier, and the "sigma" in the name of the modulator is a reference to the integrator. The example measurement circuit 100 in the example of FIG. 1 may produce a digital output $b_0$ 148 that is a sequence of logic high and logic low levels (binary digits) responsive to an analog signal voltage $V_{SIG}$ at a node 106 that is representative of analog input voltage $V_{IN}$ 102.

Also, by virtue of its switched-capacitor configuration, the electric charge received by the switched difference amplifier circuit 126 from node 106 at its input may be returned to node 106 such that the input to the delta-sigma modulator takes little to no average current from the voltage it measures. In other words, the delta-sigma modulator in the example measurement of FIG. 1 may have a high input impedance by virtue of its switched-capacitor circuit configuration. Conventional delta-sigma modulators typically use a separate analog buffer amplifier to achieve high input impedance. Thus, the delta-sigma modulator of the present disclosure may achieve high impedance without the added cost of an analog buffer amplifier.

Although the analog input voltage $V_{IN}$ 102 generally changes with time, its maximum rate of change is typically low enough to allow the output of the delta-sigma modulator to represent the input with negligible error. For example, in a typical power supply controller, the analog signal voltage $V_{SIG}$ may have a maximum value of 4 volts, a minimum value of zero volts, and may change at the maximum rate of 1.5 volts per millisecond, whereas the output may produce about 1000 binary digits (bits) per millisecond. A sequence of less than 20 bits (corresponding to 30 millivolts in a range of 4 volts) is typically sufficient to represent the value of the analog signal voltage to control the power supply. Therefore, the analog input voltage may be assumed constant for the purposes of this explanation.

Measurement circuit 100 may include a potential divider and low pass filter formed by resistor R1 104, resistor R2 108, and capacitor $C_F$ 112 to scale and filter the analog input voltage $V_{IN}$ 102 to produce an analog signal voltage $V_{SIG}$ at node 106 with respect to input return 110. The potential divider formed by resistor R1 104 and resistor R2 108 reduces the magnitude of analog input voltage $V_{IN}$ 102 to a lower value that the switched difference amplifier circuit 126 can safely accept.

The low-pass filter formed by capacitor $C_F$ 112 with resistor R1 104 and resistor R2 108 further reduces the high frequencies in analog input voltage $V_{IN}$ 102 that appear in analog signal voltage $V_{SIG}$ at node 106. Reduction of high frequencies in the analog signal voltage $V_{SIG}$ may be advantageous to the further processing of the digital output $b_0$ 148 by other circuits. The low-pass filter is often referred to as an anti-aliasing filter and is generally used in analog-to-digital converters that use delta-sigma modulators. In other words, the presence of filter capacitor $C_F$ 112 is beneficial to the desired operation of the delta-sigma modulator, and analog signal voltage $V_{SIG}$ at node 106 is a filtered input voltage. As will be explained later, filter capacitor $C_F$ 112 serves as a reservoir for electric charge that is received and delivered by the switched difference amplifier circuit 126.

For a given value of signal voltage $V_{SIG}$ that is limited to be between a minimum boundary value $V_{MIN}$ 118 and a maximum boundary value $V_{MAX}$ 114, the delta-sigma modulator in the example of FIG. 1 may produce an output $b_0$ 148 that includes a repeating sequence of high and low logic levels, with the level being either high or low for the duration of each period of a clock signal $S_C$ 150. Within the repeating sequence of high and low logic levels, the relative number of clock periods having a high logic level may correspond to the relative position of $V_{SIG}$ within the range of $V_{MIN}$ 118 to $V_{MAX}$ 114. For example, if $V_{SIG}$ is halfway between $V_{MIN}$ 118 and $V_{MAX}$ 114, the output $b_0$ 148 may be a high logic level during half the clock periods. Similarly, if $V_{SIG}$ is equal to $V_{MAX}$ 114, the output may be a high logic value during all the clock periods, and if $V_{SIG}$ is equal to $V_{MIN}$ 118, the output may be a low logic value during all the clock periods. In other words, the delta-sigma modulator modulates the density of high logic levels at its output in response to the relative position of a signal voltage between two boundary values.

In one example, the minimum boundary value $V_{MIN}$ 118 may be zero. In examples where the minimum boundary value $V_{MIN}$ 118 is zero, the density of high logic levels at the output $b_0$ 148 is the ratio of the analog signal voltage $V_{SIG}$ to the maximum boundary value $V_{MAX}$ 114.

The switched difference amplifier circuit 126 in the example of FIG. 1 includes a switched capacitor $C_{SW}$ 122 to transfer an amount of electric charge that corresponds to the difference between the analog signal voltage $V_{SIG}$ at node 106 and one of the two boundary voltages $V_{MIN}$ 118 and $V_{MAX}$ 114 during every period of the clock signal $S_C$ 150. In a first portion of a clock period (e.g., first half cycle), the charge on capacitor $C_{SW}$ 122 is a first value that corresponds to the difference between a supply voltage $V_{DD}$ 132 and analog signal voltage $V_{SIG}$ at node 106. In a practical application, the supply voltage $V_{DD}$ 132 may be greater than or equal to the maximum boundary value $V_{MAX}$ 114, although, in other examples, the supply voltage $V_{DD}$ 132 may be any voltage that is within the limitations of the components, including zero.

The switched-capacitor integrator circuit 128 may include an operational amplifier 133 that is configured to keep the voltages at its inputs substantially equal. The non-inverting input of operational amplifier 133 may be coupled to the supply voltage $V_{DD}$ 132. The voltage on the inverting input of operational amplifier 133 coupled to terminal 1 of single-pole double-throw (SPDT) switch S3 124 will also be at or near the voltage of the supply voltage $V_{DD}$ 132. Operational amplifier 133 may be a transconductance operational amplifier that produces an output current instead of an output voltage in response to a difference in voltage at its inputs. Thus, the voltage at the output of a transconductance operational amplifier is the result of the output current in the components coupled to the output.

In a second portion of the clock period (e.g., second half cycle), the charge on capacitor $C_{SW}$ 122 is a second value that corresponds to the difference between the supply voltage $V_{DD}$ 132 and either a lower boundary voltage $V_{MIN}$ 118 or an upper boundary voltage $V_{MAX}$ 114. The change in electric charge on capacitor $C_{SW}$ 122 resulting from the change in voltage on capacitor $C_{SW}$ 122 within each clock period may accumulate on an integrating capacitor $C_{INT}$ 130. The accumulated charge on integrating capacitor $C_{INT}$ 130 is represented as an integral voltage $V_{INT}$ 134 at the output of the switched-capacitor integrator 128.

Associating the accumulation of charge on integrating capacitor $C_{INT}$ 130 with the state of the output $b_0$ 148 allows the sequence of high and low logic levels of the output $b_0$ 148 to represent the relationship of the analog signal voltage $V_{SIG}$ to the boundary voltages $V_{MIN}$ 118 and $V_{MAX}$ 144. In the example of FIG. 1, integrating capacitor $C_{INT}$ 130 may either increase or decrease its charge in each period of clock signal $S_C$ 150 by the amount required to change the voltage on switched capacitor $C_{SW}$ 122. The voltage on switched capacitor $C_{SW}$ 122 may change in each period of clock signal $S_C$ 150 by an amount that depends on the logic level of output $b_0$ 148. When clock signal $S_C$ 150 is high, the voltage on switched capacitor $C_{SW}$ 122 may be equal (or at least substantially equal) to $V_{DD}$ 132 minus $V_{SIG}$. When clock signal $S_C$ 150 is low, the integrator may force one terminal of switched capacitor $C_{SW}$ 122 to be at the voltage $V_{DD}$ 132, and the other terminal of switched capacitor $C_{SW}$ 122 may be switched to either $V_{MIN}$ 118 or $V_{MAX}$ 114, depending on the logic level of output $b_0$ 148. In other words, when clock signal $S_C$ 150 goes low, the voltage on switched capacitor $C_{SW}$ 122 either increases by $(V_{SIG}-V_{MIN})$ if the output $b_0$ 148 is a logic low level or decreases by $(V_{MAX}-V_{SIG})$ if the output $b_0$ 148 is a logic high level.

For the voltages (and the charges) on switched capacitor $C_{SW}$ 122 and integrating capacitor $C_{INT}$ 130 to remain finite, the average change in voltage on each capacitor must be zero. A finite voltage (and charge) is maintained by comparing the integral voltage $V_{INT}$ 134 to a reference voltage $V_{REF}$ 138, with the result of the comparison causing the charge on switched capacitor $C_{SW}$ 122 to decrease or increase so that the integral voltage $V_{INT}$ 134 changes in a direction toward the value of the reference voltage $V_{REF}$ 138 in every period of clock signal $S_C$ 150. In some periods of clock signal $S_C$ 150, the integral voltage $V_{INT}$ 138 may cross the value of the reference voltage $V_{REF}$ 138, moving away from the reference voltage $V_{REF}$ 138 in the opposite direction, only to change direction toward the reference voltage $V_{REF}$ 138 again in the next clock period. In practical applications, the reference voltage $V_{REF}$ 138 may be a value midway between the minimum boundary voltage $V_{MIN}$ 118 and the supply voltage $V_{DD}$ 132.

The comparator 140 of switched comparator circuit 136 may be used to compare the integral voltage $V_{INT}$ 134 to a reference voltage $V_{REF}$ 138. Switched comparator circuit 136 further includes a D flip-flop 144 coupled to receive output signal 142 from comparator 140 and a clock input 146, which may be an inverted clock signal $S_C$ 150 from inverter 152. In the example of FIG. 1, D flip-flop 144 outputs the digital output $b_0$ 148 at a high logic level if the integral voltage $V_{INT}$ 134 is greater than the reference voltage $V_{REF}$ 138 and at a low logic level if the integral voltage $V_{INT}$ 134 is not greater than the reference voltage $V_{REF}$ 138. The result is that the average voltage applied to one terminal of switched capacitor $C_{SW}$ 122 is $V_{DD}$ 132, and the average voltage applied to the other terminal of switched capacitor $C_{SW}$ 122 is $V_{SIG}$. In other words, in a repeating sequence of high and low logic levels on the output $b_0$ 148, $V_{MAX}$ 144 is applied during each output high level and $V_{MIN}$ 118 is applied during each output low level when clock signal $S_C$ 150 is low so that the average voltage applied to one side of the capacitor is $V_{SIG}$.

It will now be explained in further detail how the circuit in the example of FIG. 1 produces a sequence of high and low logic levels such that the density of high logic levels is substantially equal to the relative proximity of analog voltage $V_{SIG}$ to the upper boundary voltage $V_{MAX}$ 114 within the range between the lower boundary voltage $V_{MIN}$ 118 and the upper boundary voltage $V_{MAX}$ 114.

The example of FIG. 1 shows a switched capacitor $C_{SW}$ 122 and SPDT switches S1 116, S2 120, and S3 124. A single-pole double-throw switch has one pole terminal that may be coupled to either of two switched terminals. One terminal of switched capacitor $C_{SW}$ 122 in the example of FIG. 1 is coupled to the pole terminal of SPDT switch S2 120. The other terminal of switched capacitor $C_{SW}$ 122 is coupled to the pole terminal of another SPDT switch S3 124.

The system clock signal $S_C$ 150 alternates between a high logic level and a low logic level within regular consecutive clock periods. In the example of FIG. 1, clock signal $S_C$ 150 is low during the first half of a clock period and is high during the second half of the clock period. In the example of FIG. 1, switch S2 120 and switch S3 124 are in a first position (pole terminal coupled to switched terminal 1) when clock signal $S_C$ 150 is low; switch S2 120 and switch S3 124 are in a second position (pole terminal coupled to switched terminal 2) when clock signal $S_C$ 150 is high.

In the example of FIG. 1, switched terminal 1 of SPDT switch S2 120 is coupled to the pole terminal of SPDT switch S1 116. Boundary voltages $V_{MAX}$ 114 and $V_{MIN}$ 118 are coupled respectively to switched terminal 1 and switched terminal 2 of SPDT switch S1 116. Switch S1 116 is in a first position (pole terminal coupled to switched terminal 1) when the output $b_0$ 148 is at a high logic level, and switch S1 116 is in a second position (pole terminal coupled to switched terminal 2) when output $b_0$ 148 is at a low logic level.

In other words, during a portion of the clock period when clock signal $S_C$ 150 is high, switched capacitor $C_{SW}$ 122 is coupled between the signal voltage $V_{SIG}$ at node 106 and a supply voltage $V_{DD}$ 132. During a portion of the clock period when clock signal $S_C$ 150 is low, switched capacitor $C_{SW}$ 122 is coupled between a terminal of an integrating capacitor $C_{INT}$ 130 and a boundary voltage that is either a maximum voltage $V_{MAX}$ 114 when the output $b_0$ 148 is a high logic level or is a minimum voltage $V_{MIN}$ 118 when the output $b_0$ 148 is a low logic level. The boundary voltage may be considered an offset voltage, and the switched difference amplifier circuit 126 may be considered to output a switched difference voltage that is representative of the variable offset voltage plus a difference between the filtered input voltage $V_{SIG}$ and supply voltage $V_{DD}$ 132.

Figure 2A:
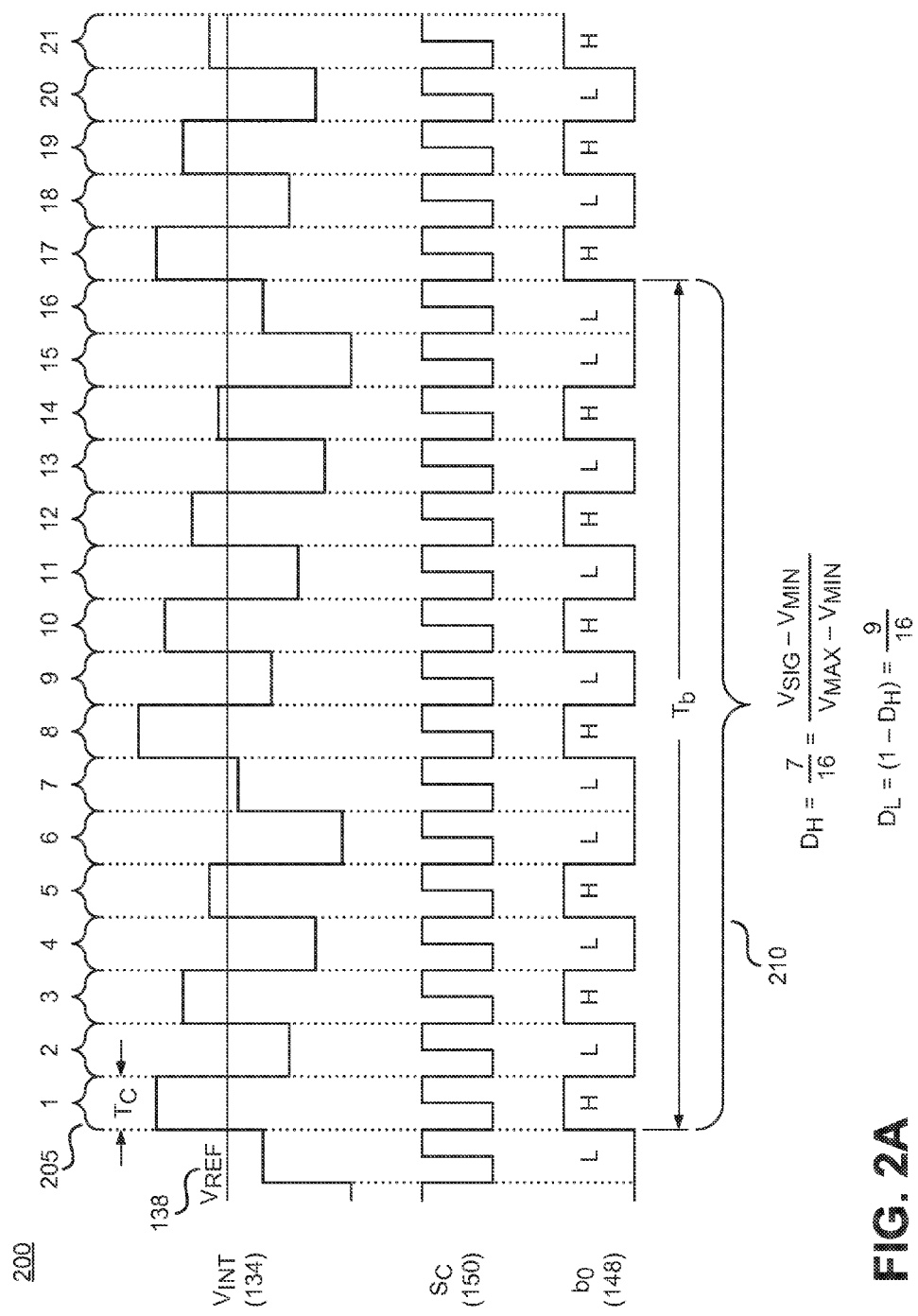
FIG. 2A and FIG. 2B are timing diagrams showing example waveforms that illustrate the operation of the example delta-sigma modulator shown in FIG. 1 for two different values of input voltage according to various examples.
Figure 2B:
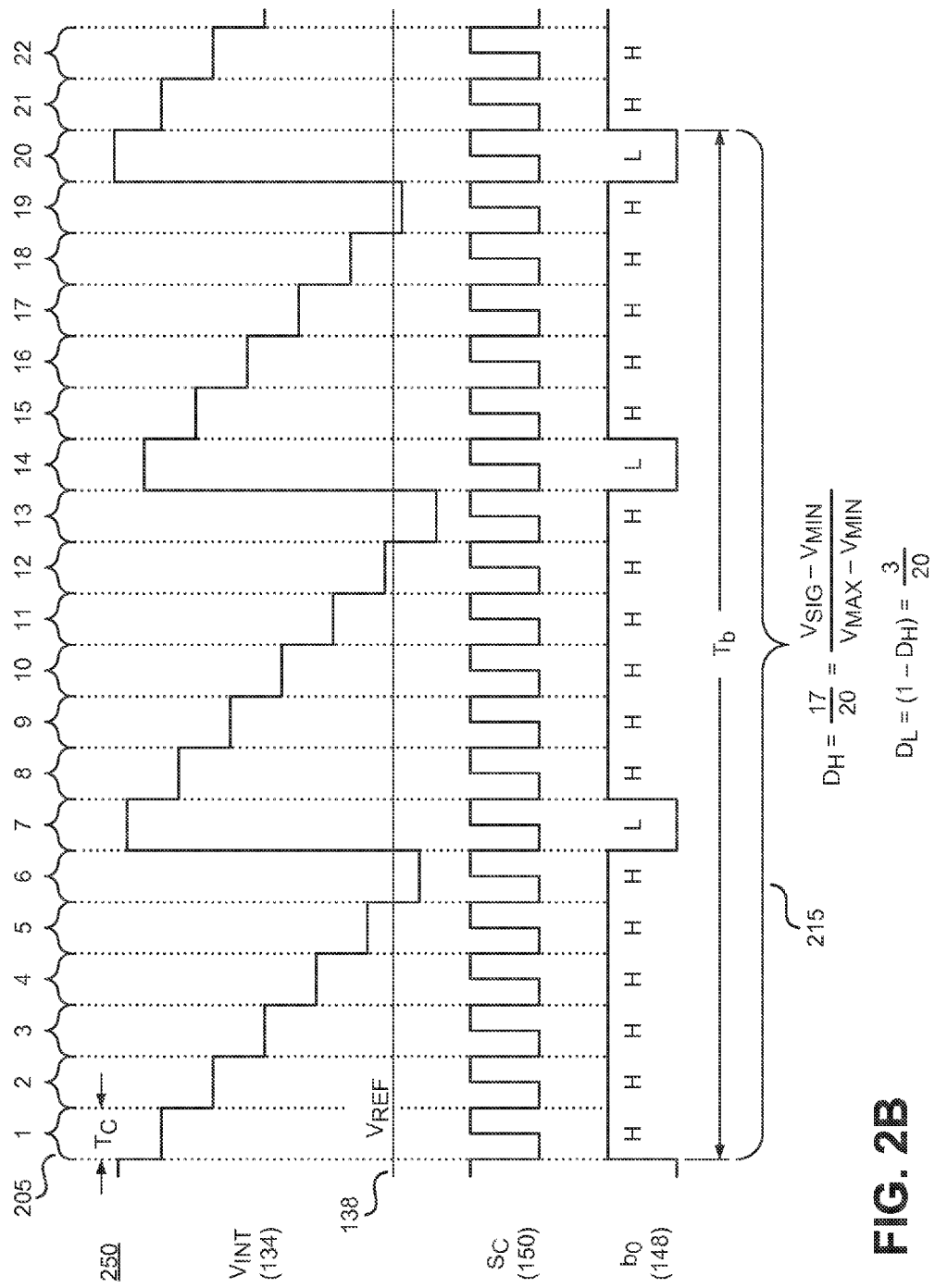

Example waveforms of selected signals from the example circuit of FIG. 1 are shown in FIG. 2A and FIG. 2B for two different values of analog signal voltage $V_{SIG}$ within the range of values between the lower boundary $V_{MIN}$ 118 and the upper boundary $V_{MAX}$ 114. FIG. 2A is a timing diagram 200 that illustrates the output $b_0$ 148 when the difference between $V_{SIG}$ and $V_{MIN}$ 118 is seven sixteenths the difference between $V_{MAX}$ 114 and $V_{MIN}$ 118. FIG. 2B is a timing diagram 250 that illustrates the output $b_0$ 148 when the difference between $V_{SIG}$ and $V_{MIN}$ is seventeen twentieths the difference between $V_{MAX}$ and $V_{MIN}$.

In the example of FIG. 2A, integral voltage $V_{INT}$ 134 and output $b_0$ 148 are shown with clock signal $S_C$ 150 that has a period $T_C$ 205. Output $b_0$ 148 is a repeating sequence of high and low logic levels having a period $T_b$ 210 that includes 16 clock periods $T_C$ 205. Within every period $T_b$ 210, the output $b_0$ 148 is a high logic level in seven of the sixteen clock periods, and the output $b_0$ 148 is a low logic level in nine of the sixteen clock periods. In other words, the density of high logic levels $D_H$ is $7/16$, and the density of low logic levels $D_L$ is $9/16$. The sum of $D_H$ and $D_L$ is unity ($D_H+D_L=1$).

FIG. 2A shows that the integral voltage $V_{INT}$ 134 changes in a direction toward the value of the reference voltage $V_{REF}$ 138 in every period of clock signal $S_C$ 150. In most periods of clock signal $S_C$ 150 in the example of FIG. 2A, the integral voltage $V_{INT}$ 134 crosses the value of the reference voltage $V_{REF}$ 138, moving away from it in the opposite direction, only to change direction toward the reference again in the next clock period.

The example of FIG. 2B shows integral voltage $V_{INT}$ 134 and output $b_0$ 148 with clock signal $S_C$ 150 that has a period $T_C$ 205 for an analog signal voltage $V_{SIG}$ that is larger than the value of analog signal voltage $V_{SIG}$ in FIG. 2A. Output $b_0$ 148 in the example of FIG. 2B is a repeating sequence of high and low logic levels having a period $T_b$ 215 that now includes 20 clock periods $T_C$ 205. Within every period $T_b$ 215, the output is a high logic level in 17 of the 20 clock periods, and the output is a low logic level in three of the 20 clock periods. In other words, the density of high logic values $D_H$ is 17/20, and the density of low logic values $D_L$ is 3/20. The sum of $D_H$ and $D_L$ is unity ($D_H+D_L=1$).

FIG. 2B, like FIG. 2A, shows that the integral voltage $V_{INT}$ 134 changes in a direction toward the value of the reference voltage $V_{REF}$ 138 in every period of clock signal $S_C$ 150. In the example of FIG. 2B the integral voltage $V_{INT}$ 134 crosses the value of the reference voltage $V_{REF}$ 138, moving away from it in the opposite direction, in only three of the 20 clock periods of an output sequence $T_b$ 215. In other words, the switched-capacitor integrator circuit 128 is coupled to receive the switched difference voltage and is configured to output an integral voltage $V_{INT}$ 134 based on a difference between the switched difference voltage and the supply voltage $V_{DD}$ 132. Furthermore, the switched comparator circuit 136 is coupled to receive the integral voltage $V_{INT}$ 134 and is configured to output an output signal $b_0$ 148 based on a difference between the switched difference voltage and a reference voltage $V_{REF}$ 138.

Figure 3A:
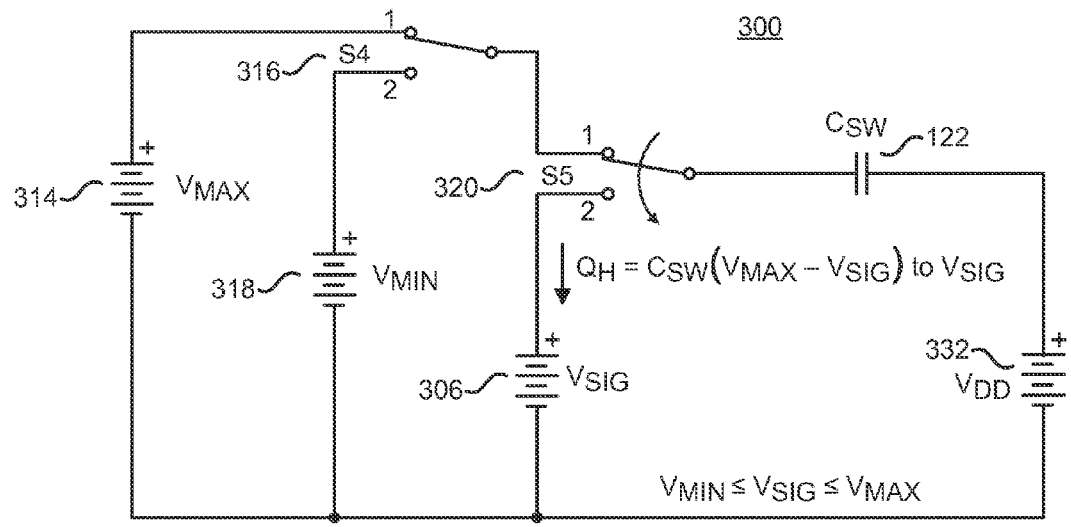
FIG. 3A and FIG. 3B are equivalent circuits of a portion of the delta-sigma modulator of FIG. 1 illustrating the transfer of electric charge to and from the voltage of the input signal according to various examples.
Figure 3B:
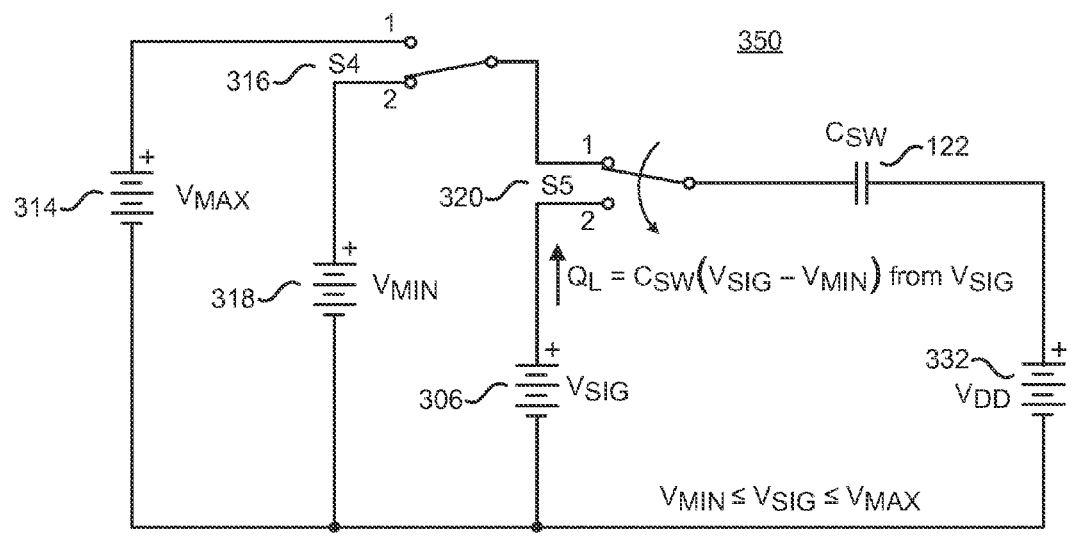

The schematic diagrams of FIG. 3A and FIG. 3B are equivalent circuits of a portion of the delta-sigma modulator in FIG. 1 that illustrate the feature of high input impedance. The equivalent circuit 300 in FIG. 3A shows the switched capacitor $C_{SW}$ 122 with one terminal coupled to a voltage source $V_{DD}$ 332 and the other terminal coupled to a voltage source $V_{MAX}$ 314 through switch S4 316 and switch S5 320. The equivalent circuit in FIG. 3A corresponds to the condition in FIG. 1 where the output $b_0$ 148 is at a high logic level and the clock signal $S_C$ 150 is at a low logic level. When clock signal $S_C$ 150 changes to a high logic level, the pole terminal of switch S5 320 will switch from terminal 1 to terminal 2, and voltage source $V_{SIG}$ 306 will receive an electric charge $Q_H$ that is the product of $C_{SW}$ multiplied by the difference of $V_{MAX}$ minus $V_{SIG}$.

The equivalent circuit 350 in FIG. 3B shows the switched capacitor $C_{SW}$ 122 with one terminal coupled to a voltage source $V_{DD}$ 332 and the other terminal coupled to a voltage source $V_{MIN}$ 318 through switch S4 316 and switch S5 320. The equivalent circuit in FIG. 3B corresponds to the condition in FIG. 1 where the output $b_0$ 148 is at a low logic level and the clock signal $S_C$ 150 is at a low logic level. When clock signal $S_C$ 150 changes to a high logic level, the pole terminal of switch S5 320 will switch from terminal 1 to terminal 2, and voltage source $V_{SIG}$ 306 will deliver an electric charge $Q_L$ that is the product of $C_{SW}$ multiplied by the difference of $V_{SIG}$ minus $V_{MIN}$.

For a repeating sequence of values of output $b_0$ 148, the total charge received by voltage source $V_{SIG}$ 306 is the density of high logic levels $D_H$ multiplied by the charge $Q_H$, and the total charge taken from voltage source $V_{SIG}$ 306 is the density of low logic levels $D_L$ multiplied by the charge $Q_L$. Since the sum of $D_H$ and $D_L$ is unity, it is straightforward to show that voltage source $V_{SIG}$ provides no net charge in a repeating sequence of the output $b_0$ 148. If $Q_{AVE}$ is the average charge taken from voltage source $V_{SIG}$ 306, we can write from FIG. 3A and FIG. 3B $$Q_{AVE}=D_L Q_L - D_H Q_H \tag{1}$$

Substituting for the density of low logic levels $D_L$ gives $$Q_{AVE}=(1-D_H)Q_L - D_H Q_H \tag{2}$$

which can be rearranged as $$Q_{AVE}=Q_L - D_H(Q_L+Q_H) \tag{3}$$

Substituting for $Q_L$, $Q_H$, and $D_H$ gives $$Q_{AVE} = C_{SW}(V_{SIG} - V_{MIN}) - \left(\frac{V_{SIG}-V_{MIN}}{V_{MAX}-V_{MIN}}\right) C_{SW}(V_{SIG}-V_{MIN}+V_{MAX}-V_{SIG}) \tag{4}$$

that simplifies to $$Q_{AVE}=C_{SW}(V_{SIG}-V_{MIN})-C_{SW}(V_{SIG}-V_{MIN}) \tag{5}$$

and $$Q_{AVE}=0 \tag{6}$$

to show that the average charge removed from voltage source $V_{SIG}$ 306 is zero. The current provided by a voltage source is the rate that charge is removed from the voltage source. In other words, the average current provided by voltage source $V_{SIG}$ 306 is zero. In the example of FIG. 1, filter capacitor $C_F$ 112 has the role of a voltage source that provides charge $Q_L$ and accepts charge $Q_H$ so that node 106 remains substantially at the fraction of the input voltage $V_{IN}$ 102 as determined by R1 104 and R2 108 while providing no average current to the input of delta-sigma modulator.

Figure 4:
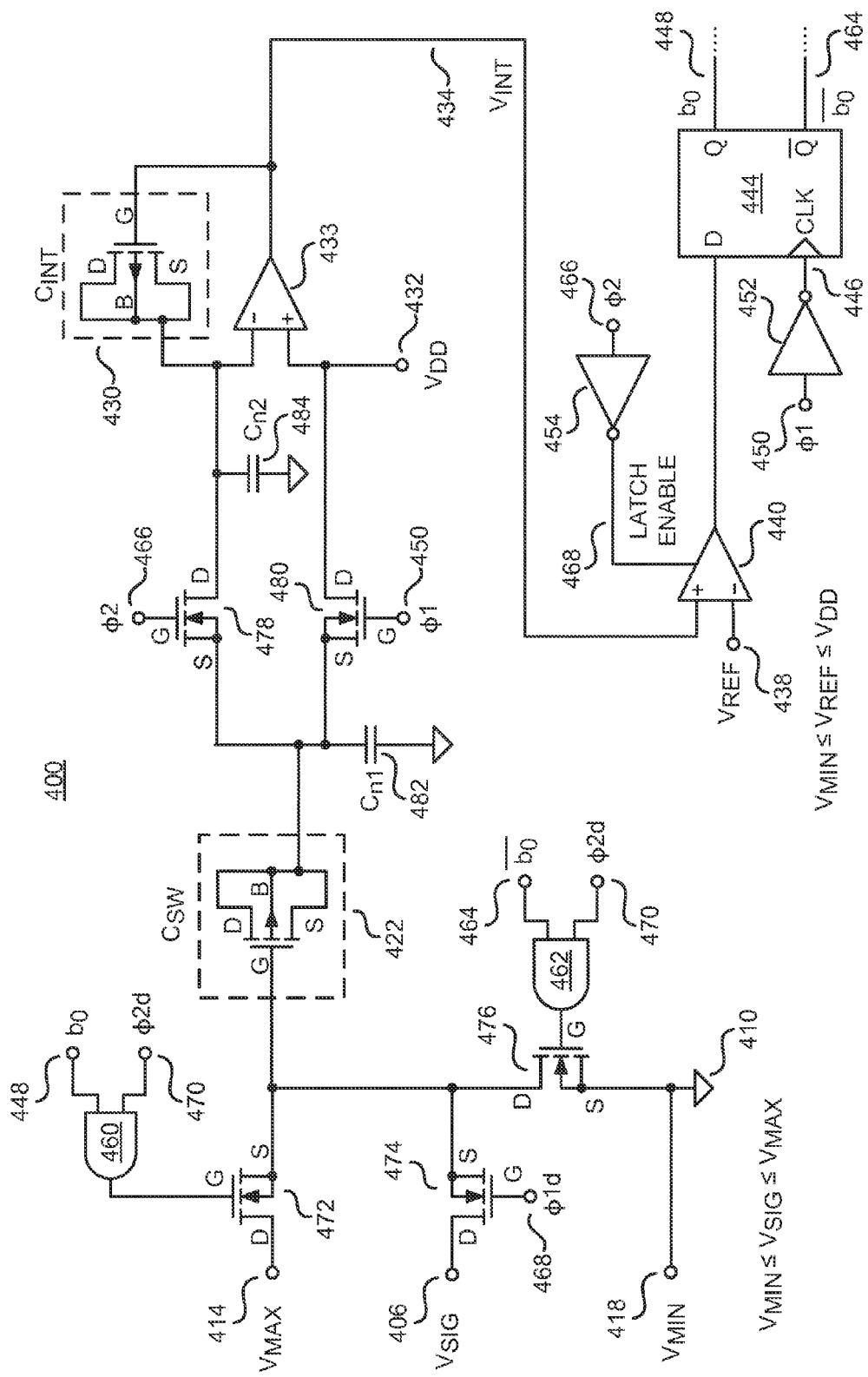
FIG. 4 is a schematic diagram of an example delta-sigma modulator that uses MOS transistors as switches and capacitors according to various examples.
Figure 5:
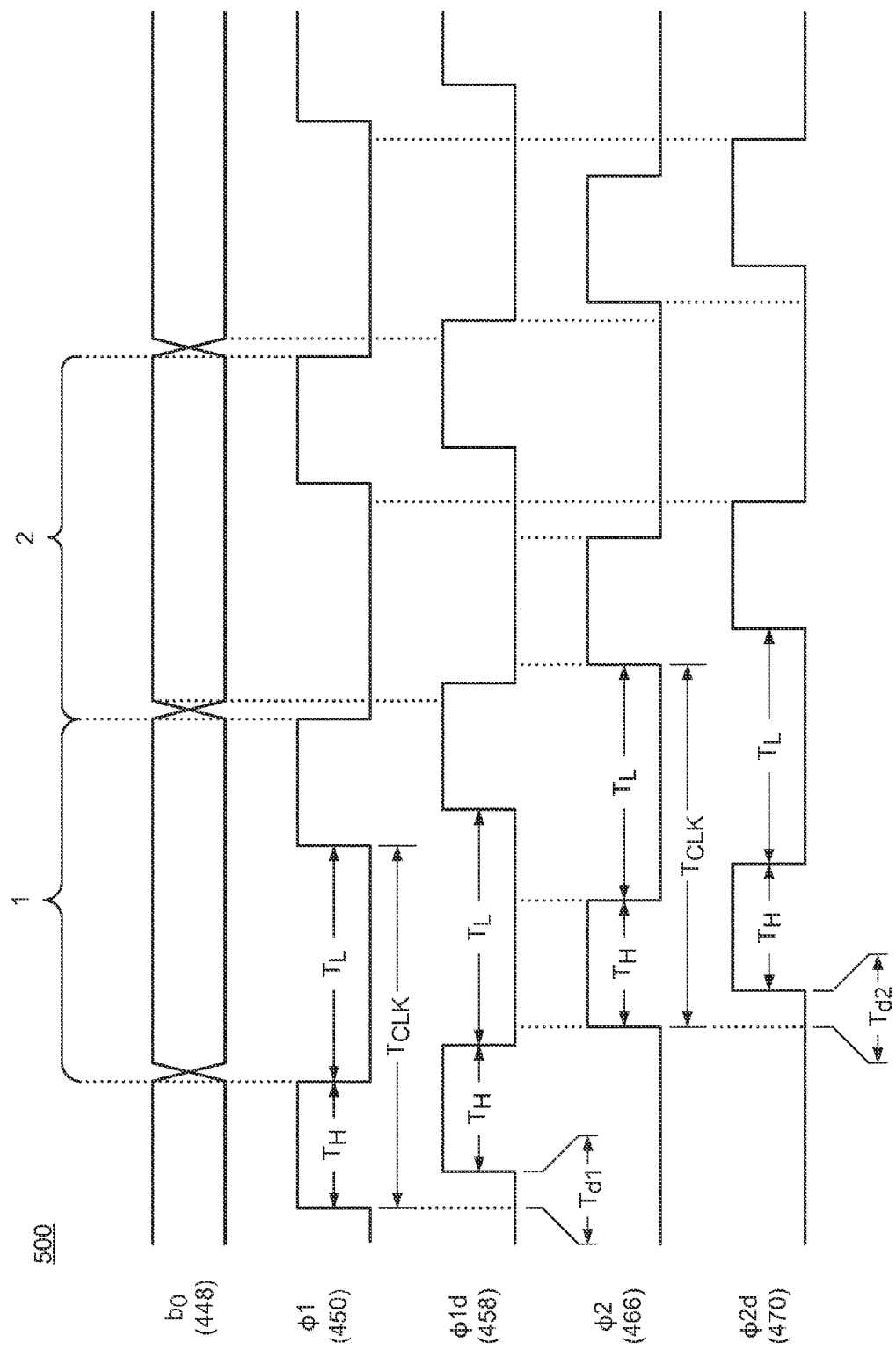
FIG. 5 is a timing diagram showing example waveforms that illustrate the relationships between clock signals in the example delta-sigma modulator of FIG. 4 according to various examples.

The example delta-sigma modulator of FIG. 1 may be realized in an integrated circuit that uses metal-oxide semiconductor field-effect transistors (MOSFETs) for the switches and also for the capacitors. A practical circuit that cannot charge capacitors instantaneously and that must allow finite time for circuits to respond may benefit from a multiphase clock that has built-in delays to allow for the response of non-ideal components. FIG. 4 is a schematic diagram 400 of an example implementation of the delta-sigma modulator of FIG. 1 using MOSFETs and a four-phase clock. FIG. 5 is a timing diagram 500 showing the phases of the four-phase clock with respect to the output in the example circuit of FIG. 4.

In the example of FIG. 4, p-channel metal-oxide semiconductor (PMOS) transistors 422 and 430 form, respectively, the switched capacitor $C_{SW}$ 122 and the integrating capacitor $C_{INT}$ 130 of FIG. 1. Each of PMOS transistors 422 and 430 has a gate terminal G, a drain terminal D, a source terminal S, and a bulk terminal B. Drain, source, and bulk terminals are coupled together at a node that is one terminal of the capacitor, and the gate terminal of the PMOS transistor is the other terminal of the capacitor. The capacitance of the PMOS transistors is linear when the transistors operate in the enhancement mode with the gate voltage more than a threshold voltage below the source voltage. Therefore, the transistors are oriented so the terminal coupled to the drain, source, and bulk has the higher voltage, and the voltages are selected to keep the PMOS transistors in their linear region.

N-channel metal-oxide semiconductor (NMOS) transistors 472, 474, 476, 478, and 480 with their bulk terminals coupled to their source terminals form single-pole single-throw (SPST) switches that can conduct when the voltage on the gate terminal with respect to the source terminal is greater than a threshold voltage. Transistors 478 and 480 with appropriate signals at their respective gates 466 and 450 form SPDT switch S3 124 of FIG. 1. Similarly, transistors 472, 474, and 476 with appropriate signals at their respective gates form the SPDT switches S1 116 and S2 120 of FIG. 1.

A four-phase clock provides the appropriate signals to switch the transistors in the example of FIG. 4. The phases of the clock are designated as φ1, φ1d, φ2, and φ2d. The clock signals are illustrated in the timing diagram 500 of FIG. 5. Two complete clock periods of duration $T_{CLK}$ are illustrated relative to the output $b_O$ 448.

During each clock period $T_{CLK}$, each phase of the clock is at a high logic level for a duration $T_H$ followed by a low logic level for a duration $T_L$. The high logic level $T_H$ of φ2 466 occurs during the low logic level $T_L$ of φ1 458. Clock signal φ1d 458 is clock signal φ1 450 delayed by an interval $T_{d1}$. Clock signal φ2d 470 is clock signal φ2 466 delayed by an interval $T_{d2}$. The delays are chosen as appropriate to accommodate the response times of the elements in the circuit.

The example circuit of FIG. 4 shows a first switch 472 controlled by the output $b_O$ 448 and clock signal φ2d 470 as inputs to an AND gate 460 that has its output coupled to the gate terminal of transistor 472. First switch 472 couples a first voltage that is the maximum boundary voltage $V_{MAX}$ 414 to a first terminal of switched capacitor $C_{SW}$ 422.

The example circuit of FIG. 4 shows a second switch 474 controlled by clock signal φ1d 468. Second switch 474 couples the filtered input voltage $V_{SIG}$ 406 to the first terminal of switched capacitor $C_{SW}$ 422.

The example circuit of FIG. 4 shows a third switch 476 controlled by clock signal φ2d 470 and inverted output 464 as inputs to an AND gate 462 that has its output coupled to the gate terminal of transistor 476. Third switch 476 couples a second voltage that is the minimum boundary voltage $V_{MIN}$ 418 to the first terminal of switched capacitor $C_{SW}$ 422. The minimum boundary voltage $V_{MIN}$ 418 in the example of FIG. 4 is zero, since it is common with the input return 410. In summary, the switched difference amplifier circuit is configured to output the switched difference voltage by selectively coupling a first terminal G of a switched capacitor $C_{SW}$ 422 to receive the filtered input voltage $V_{SIG}$ 406, a first voltage $V_{MAX}$ 414, and a second voltage $V_{MIN}$ 418. Furthermore, the switched difference voltage comprises a voltage at a second terminal B of the switched capacitor $C_{SW}$ 422.

Transconductance operational amplifier 433 in the example of FIG. 4 forms an integrator with integrating capacitor $C_{INT}$ 430. The non-inverting input of transconductance operational amplifier 433 is coupled to a supply voltage $V_{DD}$ 432, and the inverting input of transconductance operational amplifier 433 is coupled to integrating capacitor $C_{INT}$ 430. Capacitors $C_{n1}$ 482 and $C_{n2}$ 484 are relatively small NMOS capacitors that limit the amplitude of transient voltages during switching to less than a MOSFET threshold voltage above the supply voltage $V_{DD}$, preventing loss of charge from the PMOS capacitors $C_{SW}$ 422 and $C_{INT}$ 430.

In the example of FIG. 4, an integral output voltage $V_{INT}$ 434 is received at the non-inverting input of a latching analog comparator 440 that compares the integral output voltage $V_{INT}$ 434 to a reference voltage 438 at its inverting input. Latching analog comparator 440 latches the result of the comparison at its inputs when LATCH ENABLE signal 468 from the output of an inverter 454 goes to a high logic level, which is when the clock signal φ2 466 goes to a low logic level.

The output of latching analog comparator 440 is received by a D flip-flop 444 that sets the state of its outputs 448 and 464 when its clock input 446 goes to a high logic level. An inverter 452 inverts clock signal φ1 450 to become the clock input 446 to D flip-flop 444.

In one example, the supply $V_{DD}$ 432 is 5.3 volts, the maximum boundary voltage $V_{MAX}$ 414 is 4 volts, the minimum boundary voltage $V_{MIN}$ 418 is zero volts, and the reference voltage $V_{REF}$ 438 is 2.6 volts. In the same example, switched capacitor $C_{SW}$ 422 is 0.25 picofarads, integration capacitor $C_{INT}$ 430 is 0.75 picofarads, $C_{n1}$ 482 and $C_{n2}$ 484 are 0.5 picofarads. However, it should be appreciated that other values may be used depending on the application.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example voltages, currents, frequencies, power range values, times, etc., are provided for explanation purposes and that other values may also be employed in other embodiments and examples in accordance with the teachings of the present invention.

These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. A delta-sigma modulator circuit for a switched mode power converter controller, the delta-sigma modulator circuit comprising:
    a low-pass filter circuit coupled to receive an input voltage to the switched mode power converter and configured to output a filtered input voltage;
    a switched capacitor coupled to selectively receive, at a first terminal of the switched capacitor, one of the filtered input voltage, a maximum boundary voltage, and a minimum boundary voltage, and to output, at a second terminal of the switched capacitor, an amount of electric charge,
        wherein the amount of electric charge corresponds to the difference between the filtered input voltage and either the maximum boundary voltage or the minimum boundary voltage during a portion of a clock period;
    a switched-capacitor integrator circuit with an integrating capacitor, wherein the switched-capacitor integrator circuit is coupled to receive, at an input terminal, the electric charge, and to output, at an output terminal, an integral voltage based on the electric charge and a supply voltage; and
    a switched comparator circuit coupled to receive the integral voltage, compare the integral voltage with a reference voltage, and output a digital output signal representative of the filtered input voltage.

2. The delta-sigma modulator circuit of claim 1, wherein the switched capacitor comprises a first metal-oxide semiconductor (MOS) transistor and the integrating capacitor comprises a second MOS transistor, wherein the first MOS transistor and the second MOS transistor each comprises a drain terminal, a source terminal, a gate terminal, and a bulk terminal,
wherein the drain terminal, the source terminal, and the bulk terminal of the first MOS transistor are coupled together at the second terminal of the switched capacitor,
wherein the drain terminal, the source terminal, and the bulk terminal of the second MOS transistor are coupled together at a first terminal of the integrating capacitor,
wherein the gate terminal of the first MOS transistor is coupled to the first terminal of the switched capacitor, and
wherein the gate terminal of the second MOS transistor is coupled to the second terminal of the integrating capacitor and coupled to the output terminal of the switched-capacitor integrator circuit.

3. The delta-sigma modulator circuit of claim 2,
wherein the first MOS transistor and the second MOS transistor are p-channel metal-oxide semiconductor (PMOS) transistors configured to operate in an enhancement mode with a linear capacitance,
wherein, in operation, a voltage at the second terminal of the switched capacitor is greater than a threshold voltage above a voltage at the first terminal of the switched capacitor, and
wherein, in operation, a voltage at the first terminal of the integrating capacitor is greater than the threshold voltage above a voltage at the second terminal of the integrating capacitor.

4. The delta-sigma modulator circuit of claim 1,
wherein the switched capacitor is selectively coupled to each of the filtered input voltage, the maximum boundary voltage, the minimum boundary voltage, and the switched-capacitor integrator circuit through corresponding single-pole single-throw (SPST) switches, and
wherein the SPST switches are formed by metal-oxide semiconductor (MOS) transistors each comprising a drain terminal, a gate terminal, a source terminal, and a bulk terminal, wherein the bulk terminal is coupled to the source terminal.

5. The delta-sigma modulator circuit of claim 4,
wherein the MOS transistors of the SPST switches are n-channel metal-oxide semiconductor (NMOS) transistors,
wherein the SPST switches are configured to conduct when a voltage at the gate terminal with respect to the source terminal is greater than a gate threshold voltage, and
wherein the SPST switches are configured to not conduct when the voltage at the gate terminal with respect to the source terminal is less than the gate threshold voltage.

6. The delta-sigma modulator circuit of claim 5,
wherein the NMOS transistors are coupled to a four-phase clock that controls the conduction time intervals of the NMOS transistors, and
wherein each NMOS transistor is configured to conduct during at least a portion of each clock period of the four-phase clock.

7. A controller block for a switched mode power converter, the controller block comprising:
a delta-sigma modulator circuit, comprising:
a low-pass filter circuit coupled to receive an input voltage to the switched mode power converter and configured to output a filtered input voltage;
a switched capacitor coupled to selectively receive, at a first terminal of the switched capacitor, one of the filtered input voltage, a maximum boundary voltage, and a minimum boundary voltage, and to output, at a second terminal of the switched capacitor, an amount of electric charge,
wherein the amount of electric charge corresponds to the difference between the filtered input voltage and either the maximum boundary voltage or the minimum boundary voltage during a portion of a clock period;
a switched-capacitor integrator circuit with an integrating capacitor, wherein the switched-capacitor integrator circuit is coupled to receive, at an input terminal, the electric charge, and to output, at an output terminal, an integral voltage based on the electric charge; and
a switched comparator circuit coupled to receive the integral voltage, compare the integral voltage with a reference voltage, and output a digital output signal representative of the filtered input voltage.

8. The controller block of claim 7,
wherein the switched capacitor comprises a first metal-oxide semiconductor (MOS) transistor and the integrating capacitor comprises a second MOS transistor,
wherein the first MOS transistor and second MOS transistor each comprises a drain terminal, a source terminal, a gate terminal, and a bulk terminal,
wherein the drain terminal, the source terminal, and the bulk terminal of the first MOS transistor are coupled together at the second terminal of the switched capacitor,
wherein the drain terminal, the source terminal, and the bulk terminal of the second MOS transistor are coupled together at a first terminal of the integrating capacitor,
wherein the gate terminal of the first MOS transistor is coupled to the first terminal of the switched capacitor, and
wherein the gate terminal of the second MOS transistor is coupled to the second terminal of the integrating capacitor.

9. The controller block of claim 8,
wherein the first MOS transistor and the second MOS transistor are p-channel metal-oxide semiconductor (PMOS) transistors configured to operate in an enhancement mode with a linear capacitance,
wherein, in operation, a voltage at the second terminal of the switched capacitor is greater than a threshold voltage above a voltage at the first terminal of the switched capacitor, and
wherein, in operation, a voltage at the first terminal of the integrating capacitor is greater than the threshold voltage above a voltage at the second terminal of the integrating capacitor.

10. The controller block of claim 7,
wherein the switched capacitor is selectively coupled to each of the filtered input voltage, the maximum boundary voltage, the minimum boundary voltage, and the switched-capacitor integrator circuit through single-pole single-throw (SPST) switches, and
wherein the SPST switches are formed by metal-oxide semiconductor (MOS) transistors each comprising a drain terminal, a gate terminal, a source terminal, and a bulk terminal, wherein the bulk terminal is coupled to source terminal.

11. The controller block of claim 10,
wherein the MOS transistors of the SPST switches are n-channel metal-oxide semiconductor (NMOS) transistors, wherein the SPST switches are configured to conduct when a voltage at the gate terminal with respect to the source terminal is greater than a gate threshold voltage, and wherein the SPST switches are configured to not conduct when a voltage at the gate terminal with respect to the source terminal is less than the gate threshold voltage.

12. The controller block of claim 11, wherein the NMOS switches are coupled to a four-phase clock that controls the conduction time intervals of the NMOS transistors, and wherein each NMOS transistor is configured to conduct during at least a portion of each clock period of the four-phase clock.

13. A controller block for a switched mode power converter, the controller block comprising:

a low-pass filter circuit coupled to receive an input voltage and output a filtered input voltage;

a first capacitor comprising a first terminal and a second terminal;

a first switch arranged to selectively couple the filtered input voltage to the first terminal of the first capacitor, wherein the first switch is coupled to be controlled by a first phase of a four-phase clock signal;

a second switch arranged to selectively couple a maximum boundary voltage to the first terminal of the first capacitor, wherein the second switch is coupled to be controlled by an output signal and a second phase of the four-phase clock signal;

a third switch arranged to selectively couple a minimum boundary voltage to the first terminal of the first capacitor, wherein the third switch is coupled to be controlled by the second clock signal and an inverse of the output signal;

a transconductance operational amplifier comprising an inverting input terminal, a non-inverting input terminal, and an output terminal;

a second capacitor comprising:
  a first terminal coupled to the inverting input terminal of the transconductance operational amplifier; and
  a second terminal coupled to the output terminal of transconductance operational amplifier;

a fourth switch arranged to selectively couple the second terminal of the first capacitor to the inverting input terminal of the transconductance operational amplifier, wherein the fourth switch is coupled to be controlled by a third phase of the four-phase clock signal;

a fifth switch arranged to selectively couple the second terminal of the first capacitor to the non-inverting input terminal of the transconductance operational amplifier, wherein the fifth switch is coupled to be controlled by a fourth phase of the four-phase clock signal;

a latching comparator comprising:
  a non-inverting input terminal coupled to the output terminal of the transconductance operational amplifier;
  an inverting input terminal coupled to receive a reference signal; and
  an output terminal,
  wherein the latching comparator is coupled to be controlled by an inverse of the third phase of the four-phase clock signal; and a flip-flop comprising:
  a first input terminal coupled to the output terminal of the latching comparator;
  a clock input terminal coupled to receive an inverse of the fourth clock signal; and
  an output terminal to output a digital output signal representative of the filtered input voltage.

14. The controller block of claim 13, wherein the first capacitor is implemented by a first p-channel metal-oxide semiconductor (PMOS) transistor comprising a first gate terminal, a first source terminal, a first drain terminal, and a first bulk terminal, and wherein the second capacitor is implemented by a second PMOS transistor comprising a second gate terminal, a second source terminal, a second drain terminal, and a second bulk terminal.

15. The controller block of claim 14, wherein the first gate terminal is the first terminal of the first capacitor, wherein the first source terminal, the first drain terminal, and the first bulk terminal are coupled to the second terminal of the first capacitor, wherein the second gate terminal is the second terminal of the second capacitor, and wherein the second source terminal, the second drain terminal, and second first bulk terminal are coupled to the first terminal of the second capacitor.

16. The controller block of claim 13, wherein the switches are formed by n-channel metal-oxide semiconductor transistors.

* * * * *